United States Patent [19]
Verhaeghe et al.

[11] Patent Number: 5,479,132
[45] Date of Patent: Dec. 26, 1995

[54] NOISE AND GLITCH SUPPRESSING FILTER WITH FEEDBACK

[75] Inventors: Donald J. Verhaeghe; Gregory M. Smith, both of Colorado Springs, Colo.

[73] Assignee: Ramtron International Corporation, Colorado Springs, Colo.

[21] Appl. No.: 254,281

[22] Filed: Jun. 6, 1994

[51] Int. Cl.⁶ .................................................. H03K 5/00
[52] U.S. Cl. ....................... 327/553; 327/379; 327/198; 326/21
[58] Field of Search .................................... 327/551, 344, 327/335, 310, 311, 312, 205, 31, 34, 384, 552, 553, 198, 379; 326/21

[56] References Cited

U.S. PATENT DOCUMENTS

| 4,045,688 | 8/1977 | Stewart | 322/432 |
|---|---|---|---|
| 5,324,999 | 6/1994 | Hunley et al. | 327/553 |

Primary Examiner—Timothy P. Callahan
Assistant Examiner—Dinh Le
Attorney, Agent, or Firm—Peter J. Meza

[57] ABSTRACT

A filter circuit includes an input node for receiving an unfiltered input signal, an output node for providing a filtered output signal, and an intermediate node. An integrator has an input coupled to the input node and an output coupled to the intermediate node. A Schmitt trigger has an input coupled to the intermediate node and an output coupled to the output node. A reset circuit has a first input coupled to the input node, a second input coupled to the output node, and an output coupled to the intermediate node. The signal on the intermediate node is generated by integrating the unfiltered logic input signal if the input signal and the output signal are at opposite logic states. A filtered output logic signal is generated by conditioning the intermediate signal with the Schmitt trigger. The reset circuit resets the intermediate signal if the input signal and the output signal are each at a zero logic state or if the input signal and the output signal are each at a one logic state.

28 Claims, 4 Drawing Sheets

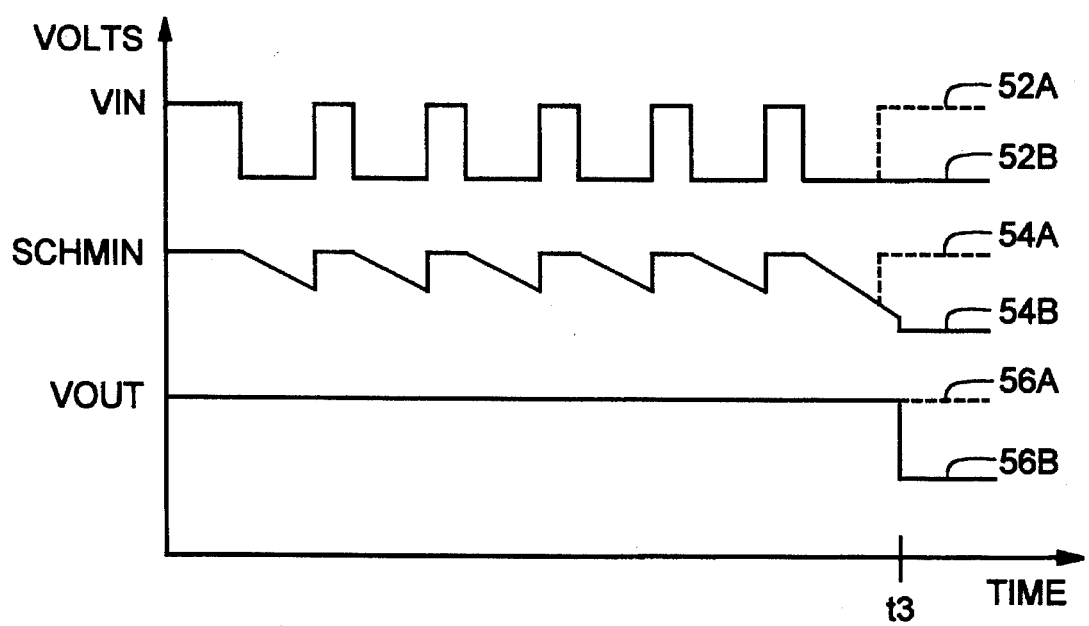
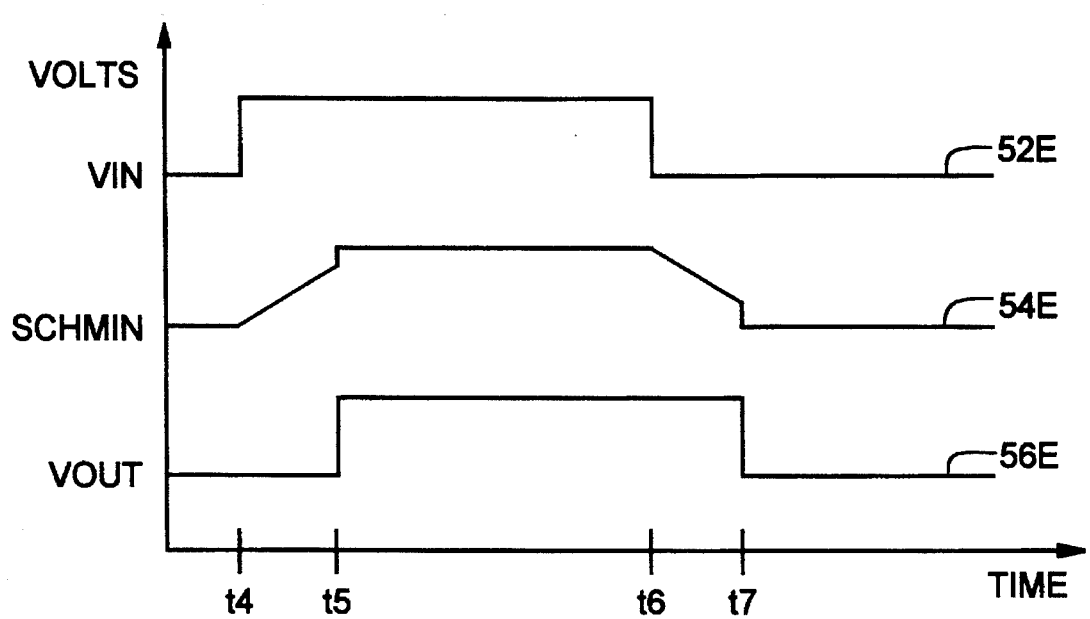

5,479,132

1

NOISE AND GLITCH SUPPRESSING FILTER WITH FEEDBACK

BACKGROUND OF THE INVENTION

This invention relates generally to integrated circuit filters. More particularly, the present invention relates to integrated filter circuits for use at the input to or within logic circuits or systems.

A prior art filter circuit 10 is shown in FIG. 1. An integrator includes a resistor 12 and capacitor 14, although other more sophisticated integrators can be used, such as an analog ramp generator or digital counter-based integrator. A logic input signal, $V_{IN}$, is coupled to the input node 18 of the integrator. An intermediate analog signal, designated "schmin" is generated at node 20, which is the integrated input signal. A Schmitt trigger conditioning circuit 16 is coupled to node 20 to receive the integrated analog signal. A logic output signal is generated at output node 22 by Schmitt trigger 16.

The prior art filter circuit 10 is useful for eliminating only certain types of noise or glitches. With reference to the timing diagrams of FIGS. 2 and 3, it can be shown that a constant stream of noise pulses or "glitches" will not be filtered and will eventually lead to the occurrence of a false output signal. In FIG. 2, an input signal $V_{IN}$ is shown as a series of positive-going noise pulses, all of which pulses are desirably filtered out by a filter circuit. Input signal waveform 18A is a stream of noise pulses terminating at a "one" logic state, whereas input signal waveform 18B returns to a "zero" logic state. The analog integrated voltage of node 20 is labeled SCHMIN in FIG. 2, and includes corresponding waveforms 20A and 20B. In operation, the SCHMIN voltage is charged and discharged according to change in polarity of the input noise signal. Eventually, the SCHMIN voltage periodically charges to the maximum available voltage, because of the duty cycle of the input signal. The maximum available voltage is the one logic state of the input voltage, typically the supply voltage of five volts. Waveform 20A shows the SCHMIN voltage finally charging to the supply voltage in response to the input signal staying at the one logic state, whereas waveform 20B shows the SCHMIN voltage discharging to zero volts in response to the input signal returning to the zero logic state. The Schmitt trigger 16 is characterized by having two distinct input threshold states, one for increasing input voltages, and another for decreasing input voltages. As the SCHMIN voltage is charged, at some time t1 the voltage crosses the input threshold voltage of Schmitt trigger 16, and a false output signal $V_{OUT}$ is generated. Output signal waveform 22A remains high, while output signal waveform 22B returns to a zero logic state as the discharging SCHMIN voltage crosses the second input threshold voltage of Schmitt trigger 16. In FIG. 3, an input signal $V_{IN}$ is shown as a series of negative-going noise pulses, all of which pulses are desirably filtered out by a filter circuit. Input signal waveform 18C terminates in a zero logic state, whereas input signal waveform 18D terminates with the stream of noise pulses returning to a one logic state. The SCHMIN voltage charges and discharges in response to the input signal and eventually periodically discharges to the minimum available voltage, because of the duty cycle of the input signal. The minimum available voltage is the zero logic state of the input voltage, typically ground. Waveform 20C shows the SCHMIN voltage finally discharging to ground in response to the input signal staying at the zero logic state, whereas waveform 20D shows the SCHMIN voltage charging back to the supply voltage in response to the input signal returning to the one logic state. As the SCHMIN voltage is discharged, at some time t1 the voltage crosses the input threshold voltage of Schmitt trigger 16, and a false output signal $V_{OUT}$ is generated. Output signal waveform 22C remains low, while output signal waveform 22D returns to a one logic state as the charging SCHMIN voltage crosses the other input threshold voltage of Schmitt trigger 16.

What is desired, therefore, is a filter circuit that is able to filter out multiple glitches or noise pulses that are closely spaced in time without generating a false output signal.

SUMMARY OF THE INVENTION

It is, therefore, a principal object of the present invention to filter out multiple noise pulses, even those closely spaced in time, without generating a false output signal.

It is another object of the invention to provide a simple filter circuit capable of being integrated with a conventional CMOS process.

According to the present invention a filter circuit includes an input node for receiving an unfiltered input signal, an output node for providing a filtered output signal, and an intermediate node. An integrator has an input coupled to the input node and an output coupled to the intermediate node. A Schmitt trigger has an input coupled to the intermediate node and an output coupled to the output node. A reset circuit has a first input coupled to the input node, a second input coupled to the output node, and an output coupled to the intermediate node. The signal on the intermediate node is generated by integrating the unfiltered logic input signal if the input signal and the output signal are at opposite logic states. A filtered output logic signal is generated by conditioning the intermediate signal with the Schmitt trigger. The reset circuit resets the intermediate signal if the input signal and the output signal are each at a zero logic state or if the input signal and the output signal are each at a one logic state, so that each new glitch or noise pulse starts the integration process anew and multiple noise pulses are thereby filtered.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 5–7 are timing diagrams associated with the filter circuit of FIG. 4A.

DETAILED DESCRIPTION

Figure 1:
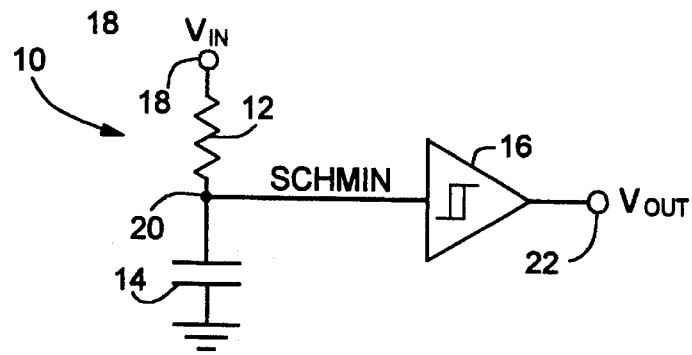
FIG. 1 is a schematic diagram of a prior art filter circuit.
Figure 2:
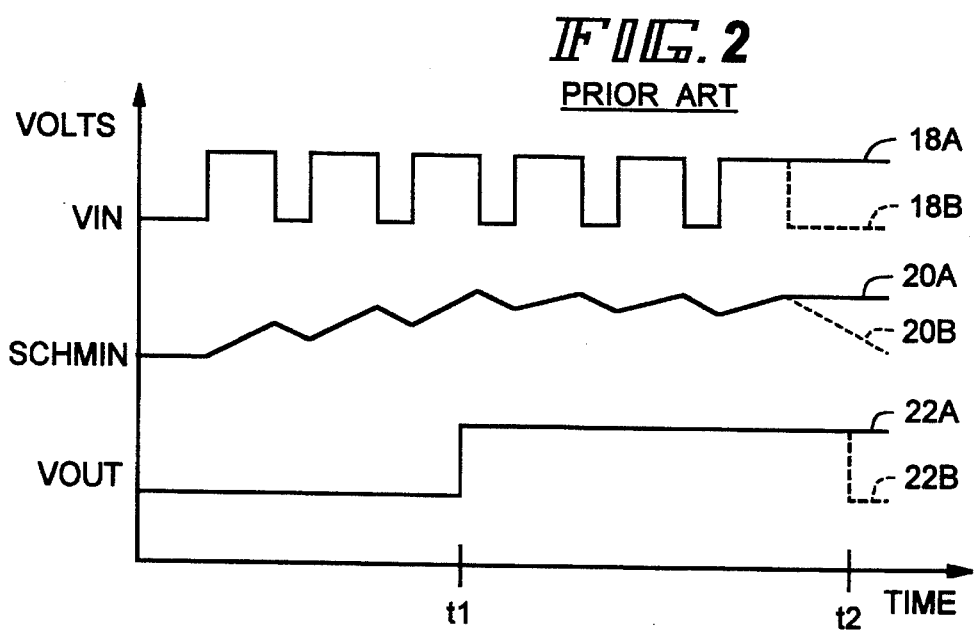
FIGS. 2 and 3 are timing diagrams associated with the prior art filter circuit of FIG. 1.
Figure 3:
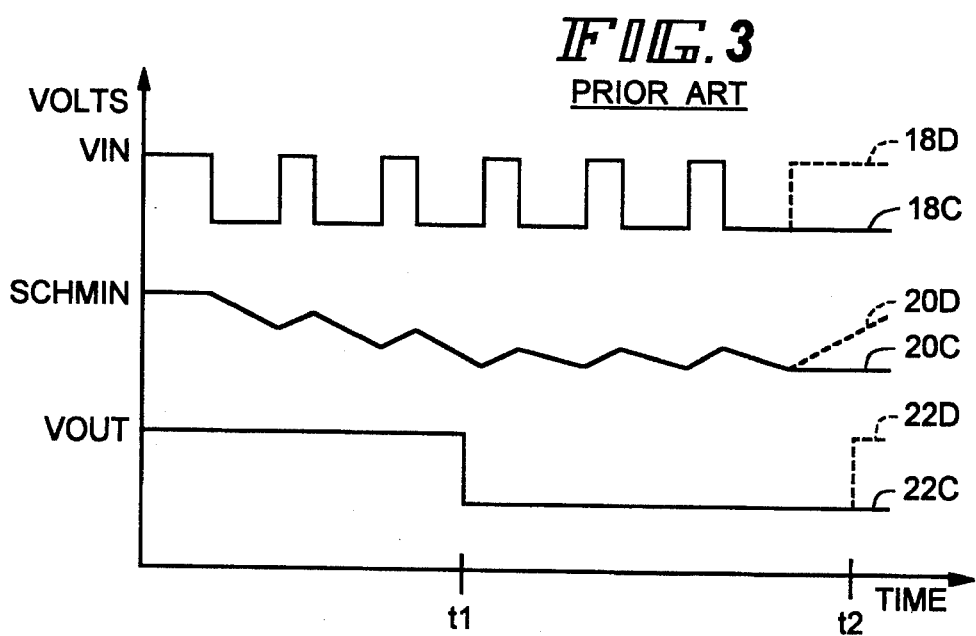
Figure 4A:
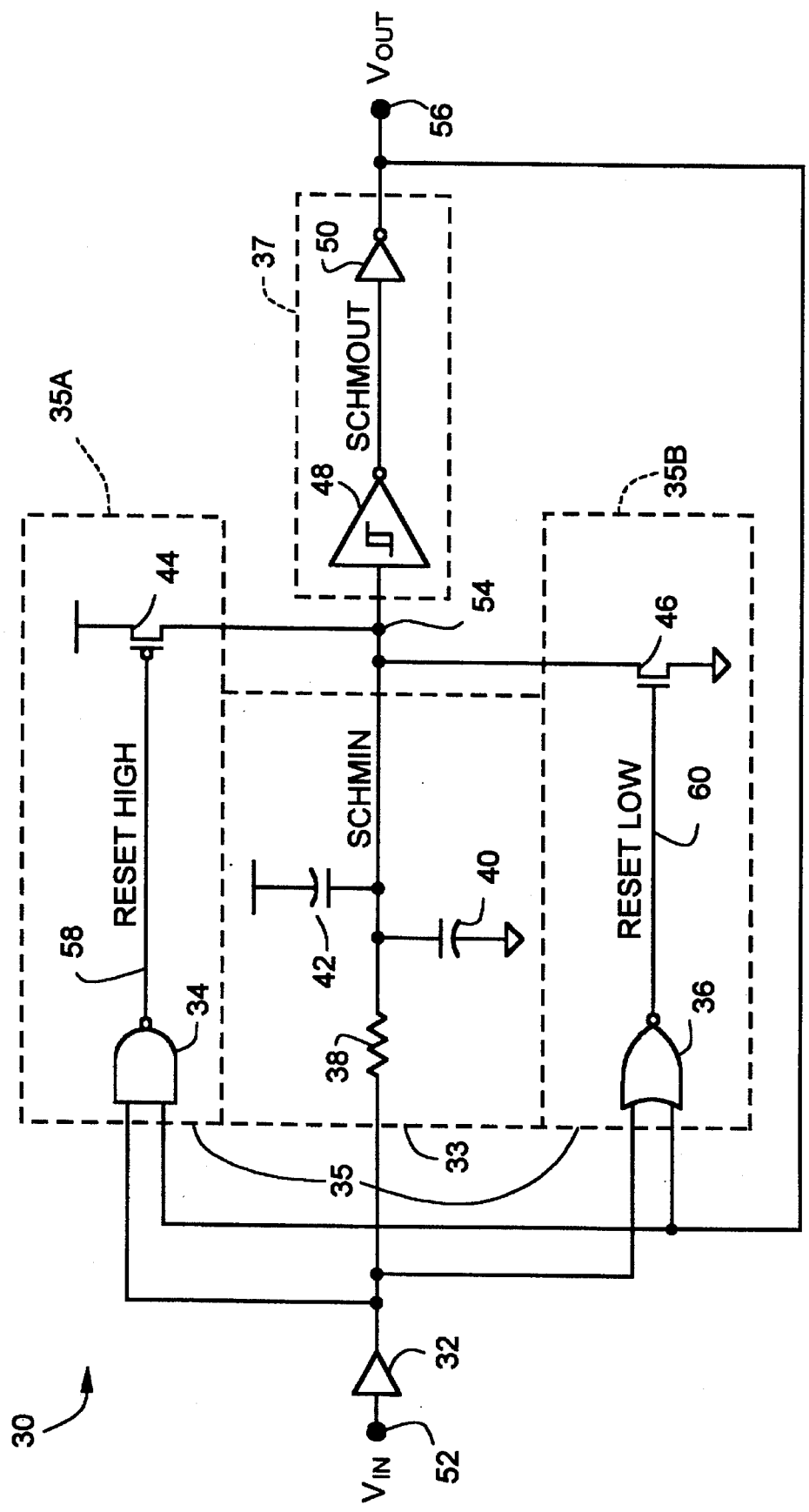
FIG. 4A is a schematic diagram of a filter circuit according to the present invention.
Figure 4B:
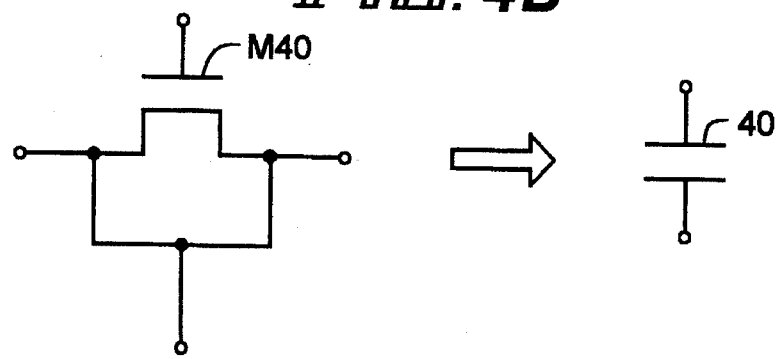
FIGS. 4B and 4C are schematic diagrams of capacitor-connected transistors that are used as capacitors in the circuit of FIG. 4A.
Figure 4C:
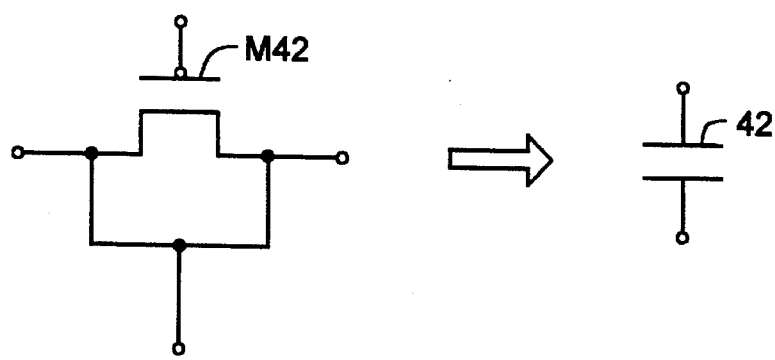

Referring now to FIG. 4A, a filter circuit 30 according to the present invention includes an input node 52 for receiving an unfiltered input signal designated $V_{IN}$, an output node 56 for providing a filtered output signal designated $V_{OUT}$, and an intermediate node 54 having an associated analog voltage designated SCHMIN (for Schmitt Trigger Input). While the schematic diagram of FIG. 4A shows a CMOS circuit, it should be appreciated by those skilled in the art that equivalent functionality can be obtained by other types of circuits such as bipolar circuits, for example. An optional input buffer stage 32 can be included to increase the input resistance of filter circuit 30 and to prevent loading of the input node 52, especially if input node 52 represents an input pin of an integrated circuit. Buffer stage 32 can also be used to "square up" analog or heavily loaded or otherwise distorted digital input signals. Buffer stage 32 can also be a "level translator" circuit if, for example, TTL input signals are present. Filter circuit 30 can be used to filter input signals presented at the input pin of an integrated circuit, or can be used to filter signals within an integrated circuit. Filter circuit 30 includes an integrator 33 consisting of a resistor 38, and capacitors 40 and 42. Turning momentarily to FIGS. 4B and 4C, in a preferred embodiment capacitors 40 and 42 are actually capacitor-connected MOS transistors. In FIG. 4B, capacitor 40 is shown as a capacitor-connected N-channel MOS transistor M40, wherein the gate of the transistor forms one of the capacitor plates, and the coupled drain and source form the other capacitor plate. Similarly, in FIG. 4C, capacitor 42 is shown as a capacitor-connected P-channel MOS transistor M42. Turning back to FIG. 4A, capacitor 40 is coupled from node 54 to ground and capacitor 42 is coupled from node 54 to the supply voltage. In this manner, the voltage dependency of the capacitors is substantially cancelled. If voltage linear capacitors are available, then either capacitor 40 or 42 may be eliminated. Resistor 38 can be a thin film or diffused resistor, or any other resistor compatible with the integrated circuit process being used. The input of integrator 33 is coupled to the input node 52 directly or indirectly through input buffer stage 32. The output of integrator 33 is coupled directly to the intermediate node 54. A signal conditioning circuit 37 includes an inverting Schmitt trigger 48 in series with an inverter 50. Schmitt trigger 48 and inverter 50 are separate stages, which is standard in CMOS design. A single non-inverting Schmitt trigger conditioning circuit 37 can be substituted if other device technologies are used. The conditioning circuit can be a buffer stage, Schmitt trigger buffer stage, inverter stage, or Schmitt trigger inverter stage. The conditioning circuit 37 has an input coupled to the intermediate node 54 and an output coupled to the output node 56. A reset circuit 35 includes first and second parallel circuit portions 35A and 35B. The reset circuit 35 has a first input coupled to the input node 52 (directly or indirectly through optional input buffer stage 32), a second input coupled to the output node 56, and an output coupled to the intermediate node 54. As is explained in further detail below, the reset circuit 35 is a circuit that forces the intermediate node 54 to a low voltage if the input node 52 and the output node 56 are each at a zero logic state, and for forcing the intermediate node 54 to a high voltage if the input node 52 and the output node 56 are each at a one logic state. The first portion 35A of the reset circuit 35 includes a NAND gate 34 having two inputs and a single output. The two inputs of the NAND gate 34 form the first and second inputs of the first reset circuit portion 35A. A P-channel transistor 44 has a gate coupled to the output of the NAND gate 34, a source coupled to the five volt power supply voltage, and a drain forming the output of the first reset circuit portion 35A. The second portion 35B of the reset circuit 35 includes a NOR gate 36 having two inputs and a single output. The two inputs of the NOR gate 36 form the first and second inputs of the second reset circuit portion 35B. An N-channel transistor 46 has a gate coupled to the output of the NOR gate 36, a source coupled to ground, and a drain forming the output of the second reset circuit portion 35B.

In operation, the filtering method of the present invention generally includes the steps of generating an unfiltered logic input signal $V_{IN}$, which is provided to the filter circuit 30 at input node 52. An intermediate signal SCHMIN is generated by integrating the unfiltered logic input signal $V_{IN}$ if the input signal $V_{IN}$ and the output signal $V_{OUT}$ are at opposite logic states. A filtered output logic signal $V_{OUT}$ is generated by conditioning the intermediate signal SCHMIN. The intermediate signal SCHMIN is reset if the input signal $V_{IN}$ and the output signal $V_{OUT}$ are each at the same logic state. Filter circuit 30 is able to suppress glitches on noisy input signals having a number of closely spaced noise pulses, in order to prevent states changes from occurring in subsequent circuitry coupled to the output node 56. Input signals can therefore be extremely noisy and not adversely affect the operation of subsequent circuitry. Glitches and noise pulses are filtered for both positive-going and negative-going glitches, i.e. glitches are symmetrically filtered. The operation of the filter circuit is described in greater detail below.

A more detailed description of the operation of filter circuit 30 proceeds with reference to drawing FIGS. 4A, 5, 6, and 7. Assume that the input voltage $V_{IN}$ and the output voltage $V_{OUT}$ are both at a zero logic state, i.e. nodes 52 and 56 are at zero volt potential. The output of NOR gate 36, designated RESETLOW on node 60, is at a one logic state, which turns on transistor 46 and forces intermediate node 54 to ground. The output of NAND gate 34, designated RESETHIGH on node 58, is at a one logic state, which turns off transistor 44 and therefore this portion of the reset circuit exerts no control on node 54. If a positive-going noise spike or pulse appears at the input node 52, the output of NOR gate 36 changes state to a zero logic state, thus turning off transistor 46. The state of the output of NAND gate 34 is unchanged. Therefore, integrator 33 is allowed to start charging. If the noise spike is removed before node 52 rises sufficiently to trigger the Schmitt trigger 48, the output node 56 remains at the zero logic state. When the input voltage returns to a sufficiently low voltage, RESETLOW will again go high, turning on transistor 46, and quickly resetting intermediate node 54. Filter circuit 30 is thus ready to filter the next positive-going noise spike. If the input signal is high for a sufficiently long time, determined by the RC time constant of resistors 38 and capacitors 40 and 42, as well as the input voltage threshold levels of Schmitt trigger 48, node 54 will charge to a level that will trip Schmitt trigger 48 and cause the output, node 56, to switch to a one logic level. When both the input and output nodes 52 and 54 are at a one logic level, the output of NAND gate 34 switches to a zero logic level, turning on transistor 44, which in turn pulls intermediate node 54 to the supply voltage.

Assume now that the input voltage $V_{IN}$ and the output voltage $V_{OUT}$ are both at a one logic state, i.e. nodes 52 and 56 are at the supply voltage potential of five volts. The output of NAND gate 34, designated RESETHIGH on node 58, is at a zero logic state, which turns on transistor 44 and forces intermediate node 54 to the power supply voltage of five volts. The output of NOR gate 36, designated RESETLOW on node 60, is at a zero logic state, which turns off transistor 46 and therefore this portion of the reset circuit exerts no control on node 54. If a negative-going noise spike or pulse appears at the input node 52, the output of NAND gate 34 changes state to a one logic state, thus turning off transistor 44. The state of the output of NOR gate 36 is unchanged. Therefore, integrator 33 is now allowed to start discharging. If the noise spike is removed before node 52 falls sufficiently to trigger the Schmitt trigger 48, the output node 56 remains at the one logic state. When the input voltage returns to a sufficiently high voltage, RESETHIGH will again go low, turning on transistor 44, and quickly resetting intermediate node 54. Filter circuit 30 is thus ready to filter the next negative-going noise spike. If the input signal is low for a sufficiently long time node 54 will discharge to a level that will trip Schmitt trigger 48 and cause the output, node 56, to switch to a zero logic level. When both the input and output nodes 52 and 54 are at a zero logic level, the output of NOR gate 36 switches to a one logic level, turning on transistor 46, which in turn pulls intermediate node 54 to ground.

The detailed operation of filter circuit 30 can thus be summarized according to the following table:

| Input Node 52 ($V_{IN}$) | Output Node 56 ($V_{OUT}$) | Int. Node 54 (SCHMIN) |
| --- | --- | --- |
| 0 | 0 | 0 |
| 0 | 1 | Discharging |
| 1 | 0 | Charging |
| 1 | 1 | 1 |

Figure 5:
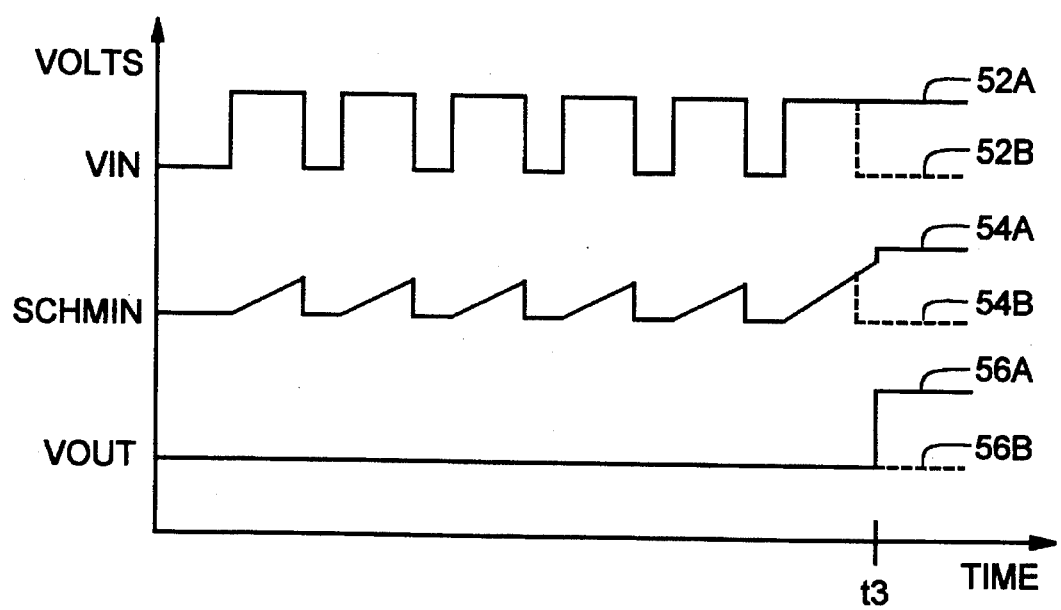

With reference now to FIGS. 5 and 6, it will be shown that filter circuit 30 is capable of filtering a number of closely spaced noise pulses or glitches. In FIG. 5, an input signal $V_{IN}$ is shown as a series of positive-going noise pulses, whose pulse width is less than a user-defined noise pulse width. Input signal waveform 52A is a stream of noise pulses terminating at a one logic state, whereas input signal waveform 52B returns to a zero logic state. The analog voltage of node 54 is labeled SCHMIN in FIG. 5, and includes corresponding waveforms 54A and 54B. Before time t3 in FIG. 5, the SCHMIN voltage is periodically charged to a voltage below the positive-going input threshold voltage of Schmitt trigger 48. The SCHMIN voltage is also periodically quickly discharged to ground when the noise pulses of the $V_{IN}$ voltage return to a zero logic state. Waveform 54A shows the SCHMIN voltage finally charging to the supply voltage in response to the input signal staying at the one logic state. At time t3, the output voltage 56A waveform correctly and abruptly changes to a logic one state as the positive-going input voltage threshold of Schmitt trigger 48 is crossed. Waveform 54B shows the SCHMIN voltage again discharging to zero volts in response to the input signal returning to the zero logic state. In this case, the output waveform 56B remains at a zero logic state. In FIG. 6, an input signal $V_{IN}$ is shown as a series of negative-going noise pulses. Input signal waveform 52C is a stream of noise pulses terminating at a zero logic state, whereas input signal waveform 52D returns to a one logic state. The analog integrated voltage of node 54 is also labeled SCHMIN in FIG. 6, and includes corresponding waveforms 54C and 54D. Before time t3 in FIG. 6, the SCHMIN voltage is periodically discharged to a voltage above the negative-going input threshold voltage of Schmitt trigger 48. The SCHMIN voltage is also periodically quickly charged to the supply voltage when the noise pulses of the $V_{IN}$ voltage return to a one logic state. Waveform 54C shows the SCHMIN voltage finally discharging to ground in response to the input signal staying at the zero logic state. At time t3, the output voltage 56A waveform correctly and abruptly changes to a logic zero state as the negative-going input voltage threshold of Schmitt trigger 48 is crossed. Waveform 54D shows the SCHMIN voltage again quickly charging to five volts in response to the input signal returning to the one logic state. In this case, the output waveform 56D remains at a one logic state.

The operation of filter circuit 30 in response to a noiseless input pulse is shown in FIG. 7. At time t4, the input signal waveform 52E changes from a zero logic state to a one logic state, and the SCHMIN waveform 54E begins to charge. At time t5, the SCHMIN waveform 54E and the output signal waveform 56E abruptly switch to a one logic state. At time t6, the input signal waveform 52E changes state to the orignal zero logic state, and the SCHMIN waveform 54E begins to discharge. At time t7, the SCHMIN waveform 54E and the output waveform 56E abruptly switch.

Having described and illustrated the principles of the invention in a preferred embodiment thereof, it is appreciated by those having skill in the art that the invention can be modified in arrangement and detail without departing from such principles. For example, if only one polarity of glitches is desired to be filtered, fully one-half of the reset circuit can be eliminated. We therefore claim all modifications and variation coming within the spirit and scope of the following claims.

We claim:

1. A filter circuit comprising:

an input node for receiving an unfiltered input signal;

an output node for providing a filtered output signal;

an intermediate node;

an integrator having an input coupled to the input node and an output coupled to the intermediate node;

a Schmitt trigger having an input coupled to the intermediate node and an output coupled to the output node; and a reset circuit having two parallel circuit portions wherein each parallel circuit portion includes a first input coupled to the input node, a second input coupled to the output node, and an output coupled to the intermediate node, wherein one of the parallel circuit portions includes:

a NAND gate having two inputs and an output, wherein the two inputs of the NAND gate form the first and second inputs of the parallel circuit portion; and a P-channel transistor having a gate coupled to the output of the NAND gate, a source coupled to a source of supply voltage, and a drain forming the output of the parallel circuit portion.

2. The filter circuit as in claim 1 in which the integrator comprises a resistor coupled between the input node and the intermediate node, and a capacitor network coupled to the intermediate node.

3. The filter circuit as in claim 2 in which the capacitor network comprises a first capacitor coupled between the intermediate node and a source of supply voltage, and a second capacitor coupled between the intermediate node and ground.

4. The filter circuit as in claim 3 in which the first capacitor comprises a capacitor-connected P-channel transistor.

5. The filter circuit as in claim 3 in which the second capacitor comprises a capacitor-connected N-channel transistor.

6. The filter circuit as in claim 1 in which the Schmitt trigger comprises an inverting Schmitt trigger in series with an inverter.

7. The filter circuit as in claim 1 further comprising a buffer having an input for receiving the unfiltered input signal and an output coupled to the input node of the filter circuit.

8. A filter circuit comprising:
an input node for receiving an unfiltered input signal;
an output node for providing a filtered output signal;
an intermediate node;
an integrator having an input coupled to the input node and an output coupled to the intermediate node;
a signal conditioning circuit having an input coupled to the intermediate node and an output coupled to the output node; and
means for forcing the intermediate node to a first voltage if the input node and the output node are each at a first logic state, and for forcing forcing the intermediate node to a second voltage if the input node and the output node are each at a second logic state having two parallel circuit portions, wherein each parallel circuit portion includes a first input coupled to the input node, a second input coupled to the output node, and an output coupled to the intermediate node, and wherein one of the parallel circuit portions includes;
a NAND gate having two inputs and an output, wherein the two inputs of the NAND gate form the first and second inputs of the parallel circuit portion; and
a P-channel transistor having a gate coupled to the output of the NAND gate, a source coupled to a source of supply voltage, and a drain forming the output of the parallel circuit portion.

9. The filter circuit as in claim 8 in which the integrator comprises a resistor coupled between the input node and the intermediate node, and a capacitor network coupled to the intermediate node.

10. The filter circuit as in claim 9 in which the capacitor network comprises a first capacitor coupled between the intermediate node and a source of supply voltage, and a second capacitor coupled between the intermediate node and ground.

11. The filter circuit as in claim 10 in which the first capacitor comprises a capacitor-connected P-channel transistor.

12. The filter circuit as in claim 10 in which the second capacitor comprises a capacitor-connected N-channel transistor.

13. The filter circuit as in claim 8 in which the signal conditioning circuit comprises a Schmitt trigger.

14. A filter circuit as in claim 8 further comprising a buffer having an input for receiving the unfiltered input signal and an output coupled to the input node of the filter circuit.

15. A filter circuit comprising:
an input node for receiving an unfiltered input signal;
an output node for providing a filtered output signal;
an intermediate node;
an integrator having an input coupled to the input node and an output coupled to the intermediate node;
a Schmitt trigger having an input coupled to the intermediate node and an output coupled to the output node; and
a reset circuit having two parallel circuit portions, wherein each parallel circuit portion includes a first input coupled to the input node, a second input coupled to the output node, and an output coupled to the intermediate node, wherein one of the parallel circuit portions includes:

a NOR gate having two inputs and an output, wherein the two inputs of the NOR gate form the first and second inputs of the parallel circuit portion; and
an N-channel transistor having a gate, coupled to the output of the NOR gate, a source coupled to ground, and a drain forming the output of the parallel circuit portion.

16. The filter circuit as in claim 15 in which the integrator comprises a resistor coupled between the input node and the intermediate node, and a capacitor network coupled to the intermediate node.

17. A filter circuit as in claim 16 in which the capacitor network comprises a first capacitor coupled between the intermediate node and a source of supply voltage, and a second capacitor coupled between the intermediate node and ground.

18. The filter circuit as in claim 17 in which the first capacitor comprises a capacitor-connected P-channel transistor.

19. The filter circuit as in claim 17 in which the second capacitor comprises a capacitor-connected N-channel transistor.

20. The filter circuit as in claim 15 in which the Schmitt trigger comprises an inverting Schmitt trigger in series with an inverter.

21. The filter circuit as in claim 15 further comprising a buffer having an input for receiving the unfiltered input signal and an output coupled to the input node of the filter circuit.

22. A filter circuit comprising:
an input node for receiving an unfiltered input signal;
an output node for providing a filtered output signal;
an intermediate node;
an integrator having an input coupled to the input node and an output coupled to the intermediate node;
a signal conditioning circuit having an input coupled to the intermediate node and an output coupled to the output node; and
means for forcing the intermediate node to a first voltage if the input node and the output node are each at a first logic state, and for forcing forcing the intermediate node to a second voltage if the input node and the output node are each at a second logic state having two parallel circuit portions, wherein each parallel circuit portion includes a first input coupled to the input node, a second input coupled to the output node, and an output coupled to the intermediate node, and wherein one of the parallel circuit portions includes:

a NOR gate having two inputs and an output, wherein the two inputs of the NOR gate form the first and second inputs of the parallel circuit portion; and
an N-channel transistor having a gate coupled to the output of the NOR gate, a source coupled to ground, and a drain forming the output of the parallel circuit portion.

23. The filter circuit as in claim 22 in which the integrator comprises a resistor coupled between the input node and the intermediate node, and a capacitor network coupled to the intermediate node.

24. The filter circuit as in claim 23 in which the capacitor network comprises a first capacitor coupled between the intermediate node and a source of supply voltage, and a second capacitor coupled between the intermediate node and ground.

25. The filter circuit as in claim 24 in which the first capacitor comprises a capacitor-connected P-channel transistor.

26. The filter circuit as in claim 24 in which the second capacitor comprises a capacitor-connected N-channel transistor.

27. The filter circuit as in claim 22 in which the signal conditioning circuit comprises a Schmitt trigger.

28. The filter circuit as in claim 22 further comprising a buffer having an input for receiving the unfiltered input signal and an output coupled to the input node of the filter circuit.

* * * * *